(12) United States Patent
Schmier et al.

(10) Patent No.: US 10,896,724 B2
(45) Date of Patent: Jan. 19, 2021

(54) NON-VOLATILE STORAGE SYSTEM WITH REDUCED PROGRAM TRANSFERS

(71) Applicant: Western Digital Technologies, Inc., San Jose, CA (US)

(72) Inventors: Jacob Schmier, Gilbert, AZ (US); Todd Lindberg, Phoenix, AZ (US); Robert Ellis, Phoenix, AZ (US)

(73) Assignee: Western Digital Technologies, Inc., San Jose, CA (US)

( * ) Notice: Subject to any disclaimer, the term of this patent is extended or adjusted under 35 U.S.C. 154(b) by 27 days.

(21) Appl. No.: 16/223,716

(22) Filed: Dec. 18, 2018

(65) Prior Publication Data
US 2020/0194065 A1 Jun. 18, 2020

(51) Int. Cl.
G06F 12/02 (2006.01)
G11C 11/56 (2006.01)
G06F 3/06 (2006.01)

(52) U.S. Cl.
CPC ........ *G11C 11/5628* (2013.01); *G06F 3/0604* (2013.01); *G06F 3/0647* (2013.01); *G06F 3/0688* (2013.01); *G06F 12/0246* (2013.01); *G11C 11/5642* (2013.01)

(58) Field of Classification Search
CPC ............. G06F 12/0246; G06F 12/0688; G06F 2212/1016; G06F 2212/7208
See application file for complete search history.

(56) References Cited

U.S. PATENT DOCUMENTS

| | | | |
|---|---|---|---|
| 8,111,548 B2 | 2/2012 | Mokhlesi | |
| 8,886,990 B2 | 11/2014 | Meir | |
| 9,176,862 B2 | 11/2015 | Chen | |
| 9,530,491 B1 | 12/2016 | Uttarwar | |
| 2010/0017562 A1* | 1/2010 | Nagadomi | G06F 12/0246 711/103 |
| 2011/0153911 A1 | 6/2011 | Sprouse | |
| 2014/0029341 A1* | 1/2014 | In | G06F 12/0246 365/185.12 |
| 2014/0063939 A1 | 3/2014 | Marcu | |
| 2014/0185376 A1 | 7/2014 | Sinclair | |
| 2015/0078080 A1 | 3/2015 | Lee | |
| 2015/0179269 A1* | 6/2015 | Lee | G11C 8/12 365/185.03 |
| 2019/0163620 A1* | 5/2019 | Muthiah | G06F 3/0688 |

\* cited by examiner

*Primary Examiner* — Than Nguyen
(74) *Attorney, Agent, or Firm* — Vierra Magen Marcus LLP

(57) ABSTRACT

A memory system comprises a plurality of memory dies and a controller (or other control circuit) connected to the memory dies. To reduce the time it takes for the memory system to program data and make that programmed data available for reading by a host (or other entity), as well as persistently store the data in a compact manner that efficiently uses space in the memory system, the data is concurrently programmed as single bit per memory cell (fast programming) and multiple bits per memory cell (compact storage). To accomplish this programming strategy, the controller concurrently transfers data to be programmed to a first memory die and a second memory die. The transferred data is programmed in the first memory die at a single bit per memory cell and in the second memory die at multiple bits per memory cell.

19 Claims, 14 Drawing Sheets

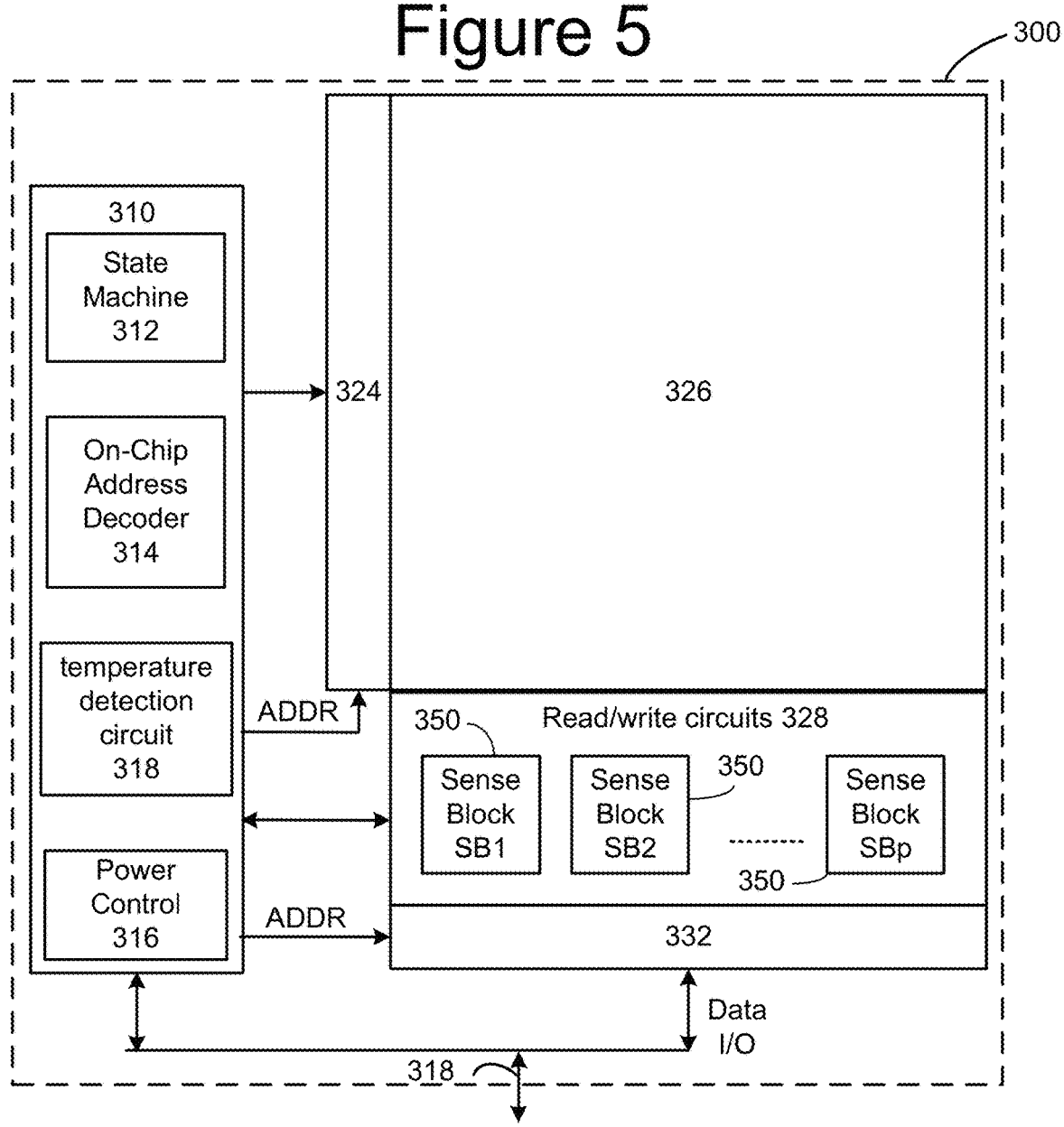
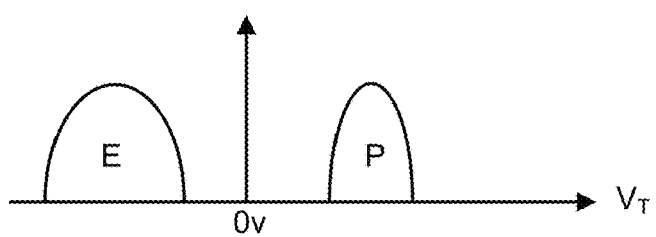

Fig. 9

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 1 | 0 | 1 | 0 | 1 | 0 | 1 | 0 | 1 | 0 | 1 | 0 | 1 | 0 |
| 3rd Higher Page | 1 | 1 | 0 | 0 | 1 | 1 | 0 | 0 | 1 | 1 | 0 | 0 | 1 | 1 | 0 | 0 |
| 2nd Upper Page | 1 | 1 | 1 | 1 | 0 | 0 | 0 | 0 | 1 | 1 | 1 | 1 | 0 | 0 | 0 | 0 |
| 1st Lower Page | 1 | 1 | 1 | 1 | 1 | 1 | 1 | 1 | 0 | 0 | 0 | 0 | 0 | 0 | 0 | 0 |

Fig. 10

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 0 | 1 | 1 | 0 | 0 | 1 | 1 | 0 | 0 | 1 | 1 | 0 | 0 | 1 |
| 3rd Higher Page | 1 | 1 | 0 | 0 | 0 | 0 | 1 | 1 | 1 | 1 | 0 | 0 | 0 | 0 | 1 | 1 |
| 2nd Upper Page | 1 | 1 | 1 | 1 | 0 | 0 | 0 | 0 | 0 | 0 | 0 | 0 | 1 | 1 | 1 | 1 |
| 1st Lower Page | 1 | 1 | 1 | 1 | 1 | 1 | 1 | 1 | 0 | 0 | 0 | 0 | 0 | 0 | 0 | 0 |

| Cycle | BUS[7] | BUS[6] | BUS[5] | BUS[4] | BUS[3] | BUS[2] | BUS[1] | BUS[0] |
|---|---|---|---|---|---|---|---|---|
| First cycle | CA7 | CA6 | CA5 | CA4 | CA3 | CA2 | CA1 | CA0 |
| Second cycle | X | CA14 | CA13 | CA12 | CA11 | CA10 | CA9 | CA8 |
| Third cycle | X | PA6 | PA5 | PA4 | PA3 | PA2 | PA1 | PA0 |
| Fourth cycle | PA14 | PA13 | PA12 | PA11 | PA10 | PA9 | PA8 | PA7 |
| Fifth cycle | X | PA21 | PA20 | PA19 | PA18 | PA17 | PA16 | PA15 |

X=don't' care bit

NON-VOLATILE STORAGE SYSTEM WITH REDUCED PROGRAM TRANSFERS

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Users of a memory system can program data into the memory system and read that data back out. In addition to reliably storing data, performance of the memory system is important to a user. For example, an entity attempting to store data in a memory system does not want to wait a long time for the programming of the data into the memory system to complete.

BRIEF DESCRIPTION OF THE DRAWINGS

Like-numbered elements refer to common components in the different figures.

FIG. 5 is a block diagram of one embodiment of a memory die.

FIG. 6 depicts threshold voltage distributions.

FIG. 9 is a table describing one example of an assignment of data values to data states.

FIG. 10 is a table describing one example of an assignment of data values to data states.

DETAILED DESCRIPTION

Figure 1:
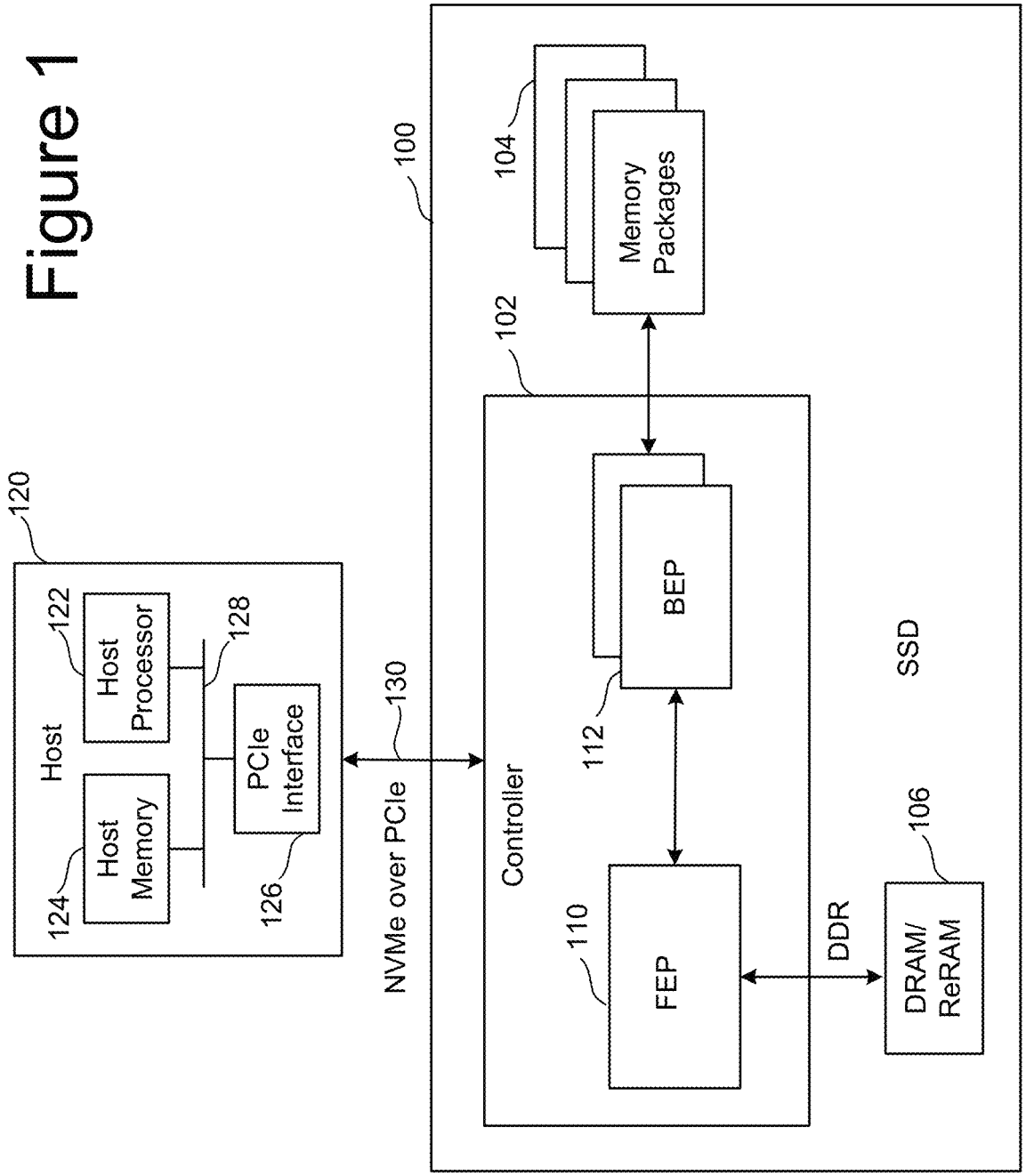
FIG. 1 is a block diagram of one embodiment of a memory system connected to a host.

Non-volatile memory typically comprises one or more memory arrays that include a plurality of memory cells. A memory cell is the basic unit of storage. In the past, each memory cell was used to store one bit of data. Over time, memory arrays have been developed that store more than one bit of data per memory cell. Storing multiple bits of data per memory cell allows the data to be stored more compactly and efficiently so that the capacity of the memory array increases. However, as the number of bits per memory cell increase, the time needed to program data into the memory cells increases. From a user point of view, this means waiting to access data until after the programming process has completed. To address this issue, the memory system can program a first copy of the data as one bit of data per memory cell and program a second copy of the data as multiple bits per memory cell. The first copy of the data stored as one bit per memory cell is programmed much faster than the second copy stored a multiple bits per memory cell. The user can be notified of a successful program operation and the data can be made available to the user after the first copy of the data as one bit of data per memory cell has completed programming. Later when the second copy of the data as multiple bits of data per memory cell has completed programming, the first copy of the data can be discarded. In this manner, the programming process appears to the user to be fast (due to the programming as one bit of data per memory cell) and spatially compact (due to the programming as multiple bits of data per memory cell).

One issue with the above technique of programming a first copy of the data as one bit of data per memory cell and programming a second copy of the data as multiple bits per memory cell is that the data is transferred to the memory dies twice: once for programming the first copy and a second time for programming the second copy. This slows down the programming process and ties up the data bus for twice the time needed to transfer the data, preventing the data bus from being used for other tasks.

Some prior memory systems will transfer the data to a memory die once, for programming the first copy of the data as one bit of data per memory cell. Subsequently, the same memory die will be issued a command to copy the data from a first location at one bit per memory cell to a second location on the same die at multiple bits per memory cell. While this scheme avoids multiple transfers of the same data on the data bus, it limits the programming to serial processes on the same die. Such a scheme also takes longer than concurrent programming on different dies.

To remedy the above-described shortcomings, it is proposed to perform single bit per memory cell programming of first data to a first location (e.g., on a first memory die) and multiple bit per memory cell programming of the first data to a second location (e.g., on a second memory die) using a common data transfer. One embodiment of such a memory system comprises a plurality of memory dies and a controller (or other control circuit) connected to the memory dies. To reduce the time it takes for the memory system to program data and make that programmed data available to a host (or other entity), as well as persistently store the data in a compact manner that efficiently uses space in the memory system, the data is concurrently programmed at a first (smaller) density per memory cell (faster programming) and at a second (higher) density per memory cell (more efficient storage). To accomplish this programming strategy, the controller concurrently transfers data to be programmed to a first memory die and a second memory die. The transferred data is then programmed in the first memory die at the first density and in the second memory die at the second density.

In some embodiments, the controller (or other control circuit) reports successful programming of the data to the host (or other entity) subsequent to completion of programming of the transferred data in the first memory die at the first density per memory cell and prior to completion of programming the transferred data in the second die at the second density per memory cell. Once the programming of the transferred data in the second memory die at the second density per memory cell has completed, the copy of the data stored first memory die at the first density per memory cell can be erased and the corresponding memory cells can be used for storing new/other data.

FIG. 1 is a block diagram of one embodiment of a memory system 100 connected to a host 120. Memory system 100 can implement the technology proposed herein for programming at different densities per memory cell based on a common data transfer so that data is stored efficiently and available quickly. Many different types of memory systems can be used with the technology proposed herein. One example memory system is a solid state drive ("SSD"); however, other types of memory systems can also be used. Memory system 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
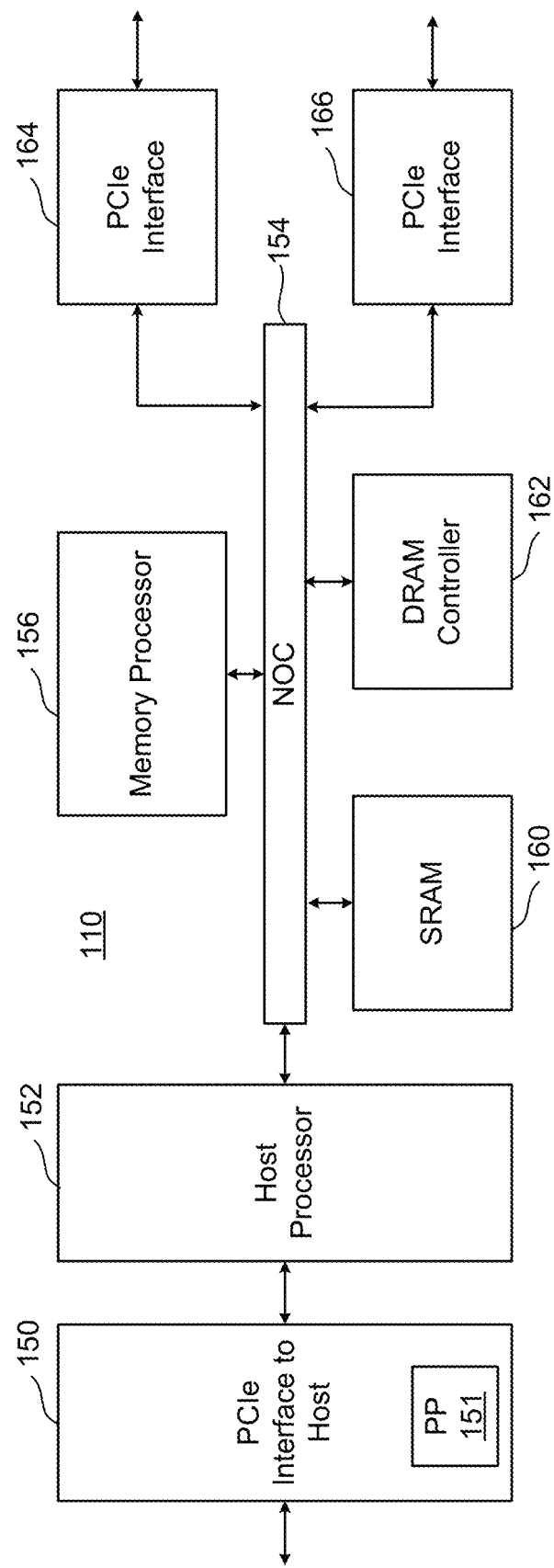
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
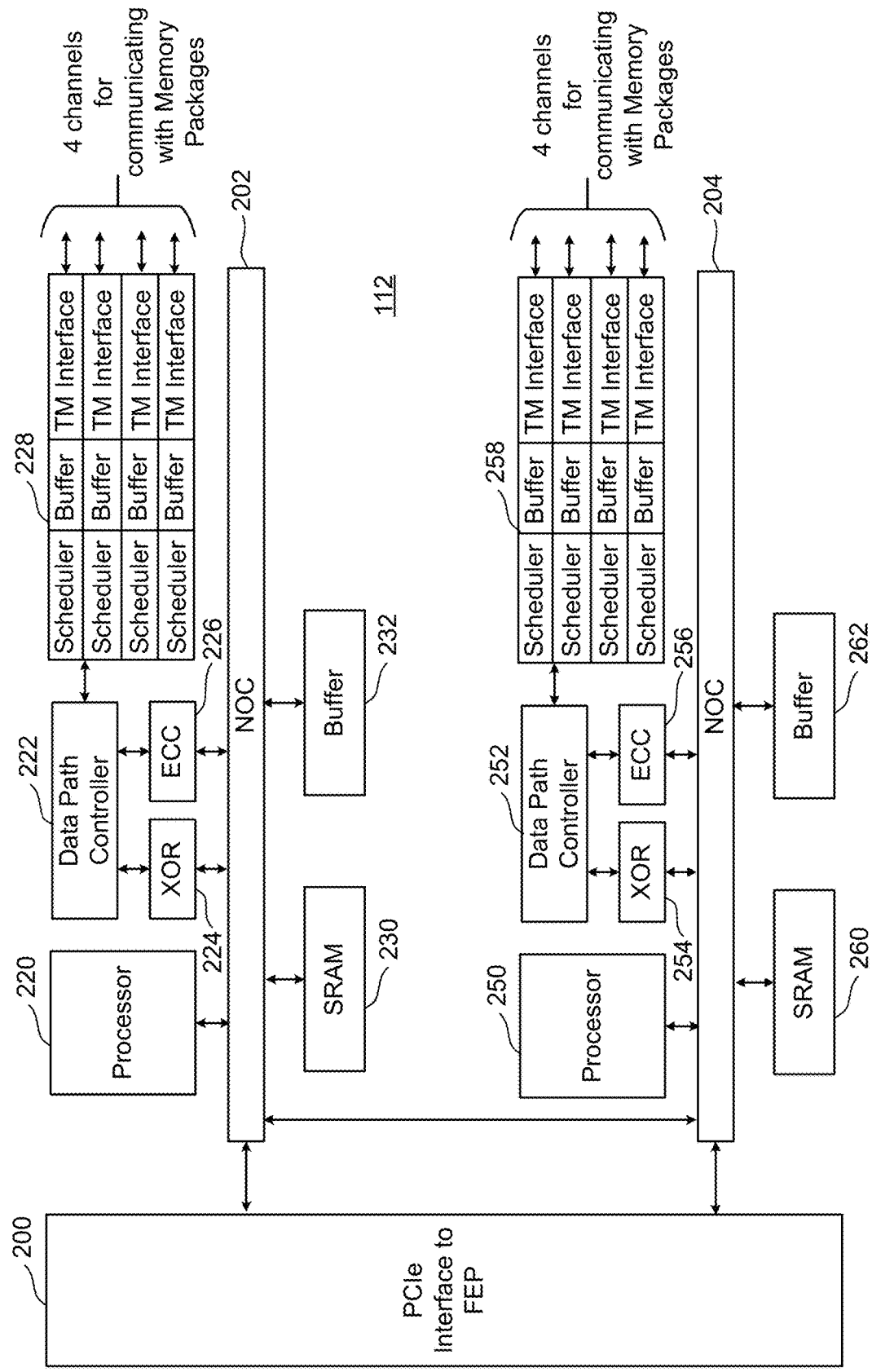
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to a memory interface 228 for communicating via four channels with memory packages. Thus, the top NOC 202 is associated with memory interface 228 for four channels for communicating with memory packages and the bottom NOC 204 is associated with memory interface 258 for four additional channels for communicating with memory packages. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 3. Additionally, controller with structures different than FIGS. 2 and 3 can also be used with the technology described herein.

Figure 4:
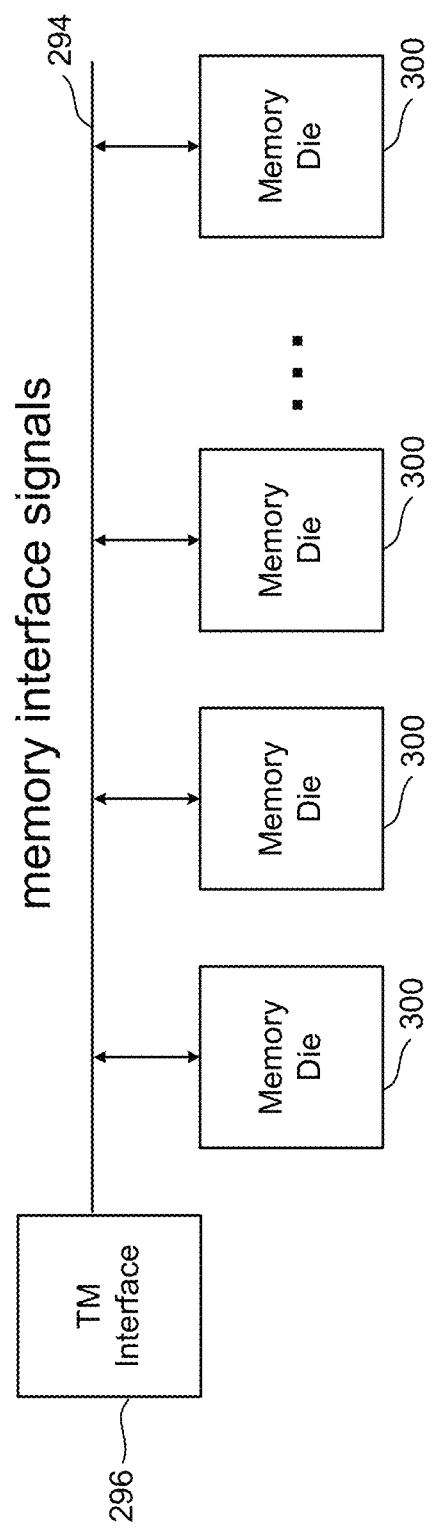
FIG. 4 is a block diagram of one embodiment of a memory package.

FIG. 4 is a block diagram of one embodiment of a memory package 104 that includes a plurality of memory die 300 connected to a set of memory interface signals 294. The memory interface signals 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes sixteen memory die; however, other numbers of memory die can also be implemented. The technology described herein is not limited to any particular number of memory die. FIG. 4 shows that some memory systems comprise a plurality of memory dies 300 each having non-volatile memory cells that store data, where the memory dies are connected to a control circuit (e.g., controller 102 or other control circuit, such as a microprocessor, state machine, FPGA, etc.). The controller (or other control circuit) is used to transfer data to the memory dies, program the data in the memory dies, read the date from the memory dies and transfer the data read from the memory dies.

FIG. 5 is a functional block diagram of one embodiment of a memory die 300. Each of the one or more memory die 130 of FIG. 4 can be implemented as memory die 300 of FIG. 5. The components depicted in FIG. 5 are electrical circuits. In one embodiment, each memory die 300 includes a memory structure 326, control circuitry 310, row decoder 324, column decoder 332 and read/write circuits 328, all of which are electrical circuits. Memory structure 326 is addressable by word lines via row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred in and out of the memory die 300 via memory die interface 318, which connects to memory interface signals 294 of a memory package 104 (se FIG. 4).

Examples of memory die interface 318 include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement memory die interface 318.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus [0:7] | Input/Output | Data Input/Output (I/O) signal bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

In some example implementations, memory interface signals 294 of a memory package 104 (see FIG. 4) comprises the signals of Table 1; however, including multiple CEn signals (e.g., CEn0, CEn1, CEn2, . . . ). In one embodiment, memory interface signals 294 includes four CEn signals (e.g., CEn0, CEn1, CEn2, CEn3), the memory package 104 includes sixteen memory die 300, and each of the CEn signals is connected to four memory die 300 of the same package. In these embodiments, the same signal bus BUS[0:7] is connected to multiple memory dies 300; therefore, the multiple CEn signals (e.g., CEn0, CEn1, CEn2, CEn3) and chip addresses (see below) are used to select a subset of memory dies for a given operation.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

At the end of a successful programming process (with verification), the threshold voltages of the memory cells in memory array 326 should be within one or more distributions of threshold voltages for programmed memory cells or within a distribution of threshold voltages for erased memory cells.

FIG. 6 illustrates example threshold voltage distributions (also called data states) for the memory cell array when each memory cell stores one bit of data. Memory cells that store one bit per memory cell are referred to as Single Level Cells ("SLC"). Two data states are depicted: state E and state P. State E corresponds to memory cells that are erased. State P corresponds to memory cells that are programmed. In one embodiment, state E corresponds to distribution of threshold voltages below 0 volts and state P corresponds to distribution of threshold voltages above 0 volts. In other embodiments, both states can be above zero volts or both can be below zero volts. In one example, memory cells of a block are initially erased. Those memory cells that are to store data "1" will remain erased in state E. Those memory cells that are to store data "0" will be programmed to state P. In other embodiments, state E can store "0" and state P can store "1."

While FIG. 6 shows example threshold voltage distributions for SLC, other embodiments store data as multiple bits per memory cell. Memory cells that store multiple bits per memory cell are referred to as Multi-Level Cells ("MLC"). MLC memory cells can be used to stored two bits per memory cell, three bits per memory cell, four bits per memory cell, five bits per memory cell, etc.

Figure 7:
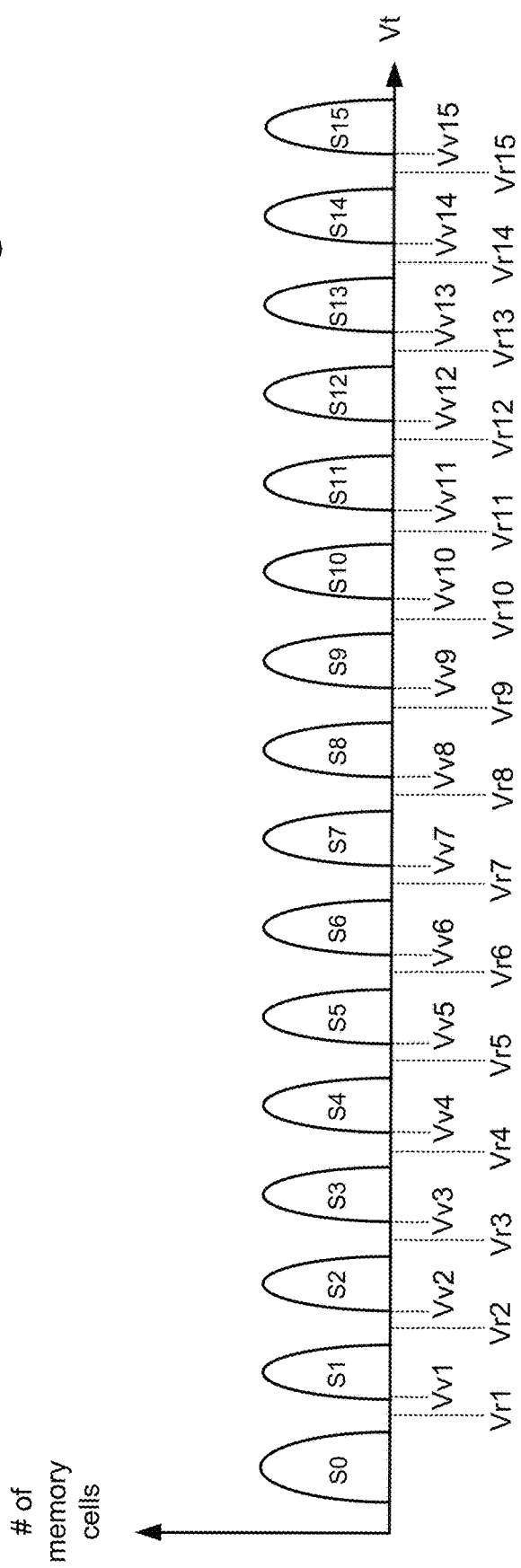
FIG. 7 depicts threshold voltage distributions.

FIG. 7 illustrates example threshold voltage distributions for memory cells that store four bits of data per memory cell. Other embodiments, however, may use other densities of data per memory cell (e.g., such as one, two, three, or five bits of data per memory cell). FIG. 7 shows sixteen threshold voltage distributions, corresponding to sixteen data states. The first threshold voltage distribution (data state) S0 represents memory cells that are erased. The other fifteen threshold voltage distributions (data states) S1-S15 represent memory cells that are programmed. Each threshold voltage distribution (data state) corresponds to predetermined values for the set of data bits. The specific relationship between the data programmed into the memory cell and the threshold voltage levels of the memory cell depends upon the data encoding scheme adopted for the memory cells. In one embodiment, data values are assigned to the threshold voltage distributions using a Gray code assignment so that if the threshold voltage of a floating gate erroneously shifts to its neighboring threshold voltage distribution, only one bit will be affected.

FIG. 7 shows fifteen read reference voltages, Vr1, Vr2, Vr3, Vr4, Vr5, Vr6, Vr7, Vr8, Vr9, Vr10, Vr1, Vr12, Vr13, Vr14 and Vr15, for reading data from memory cells. By testing whether the threshold voltage of a given memory cell is above or below the fifteen read reference voltages, the system can determine what data state (i.e., S0, S1, S2, S3, . . . ) the memory cell is in.

FIG. 7 also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15. For example, while some memory cells are being programmed from data state S0 to data state S1, other memory cells are concurrently being programmed from data state S0 to data state S2 and/or from data state S0 to data state S3, and so on.

The technology described herein can also be used with other types of programming in addition to full sequence programming, including (but not limited to) multiple stage/phase programming where the data is programmed over multiple stages. For example, the memory cells can be first programmed to a set of intermediate stages and, subsequently, the memory cells are programmed from the intermediate stages to final data states.

Figure 8:
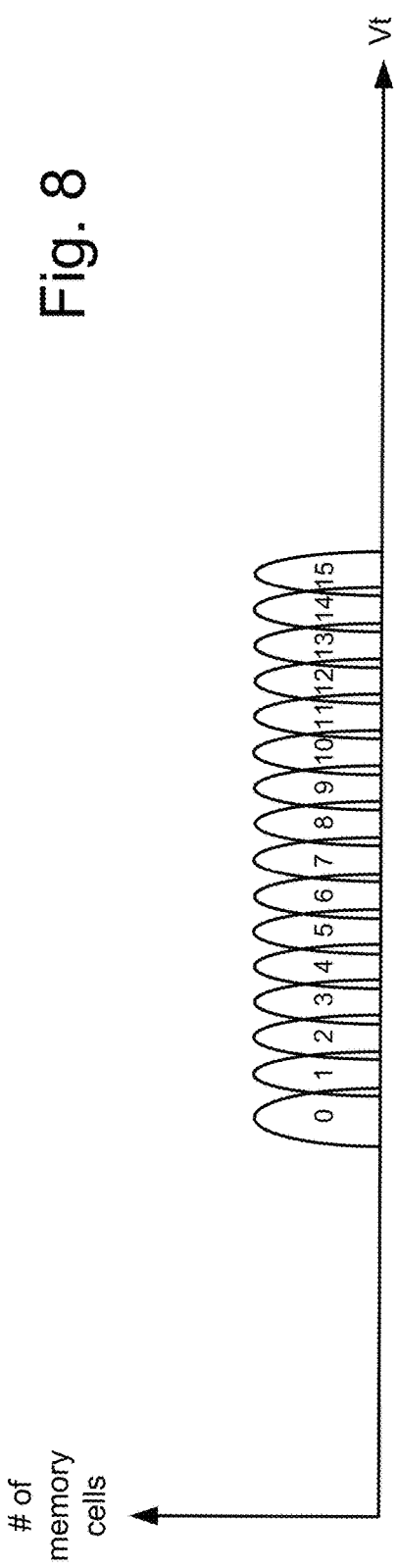
FIG. 8 depicts threshold voltage distributions.

FIG. 8 illustrates that another embodiment of threshold voltage distributions corresponding to data states S0-S15 that partially overlap since the error correction can correct a certain percentage of data that is in error. Because of the size of the drawing, the references to the data states have been truncated such that 0 is used rather than S0, 1 is used rather than S1, 2 is used rather than S2, and so on.

Each data states of FIG. 7 (or FIG. 8) corresponds to predetermined values for the data bits stored in the memory cells programmed to the respective data states. FIG. 9 is a table providing an example of the data values assigned to each data state 0-15 (or S0-S15). In one embodiment, a memory cell storing four bits of data stores that data in four different pages. The four pages are referred to as the 1st lower page, 2nd upper page, 3rd higher page and 4th top page. FIG. 9 depicts the data in each page for each data state 0-15 (or S0-S15). In one embodiment, each page is programmed separately. In another embodiment, all four data bits for a memory cell are programmed at the same time.

FIG. 10 is a table providing another example of the data values assigned to each data state 0-15 (or S0-S15). The data values of FIG. 10 utilize a Gray code assignment so that only one bit changes between neighboring data states. This arrangement reduces the number of error bits if the threshold voltage of a memory cells is too low or too high.

Figures 11A, 11B:
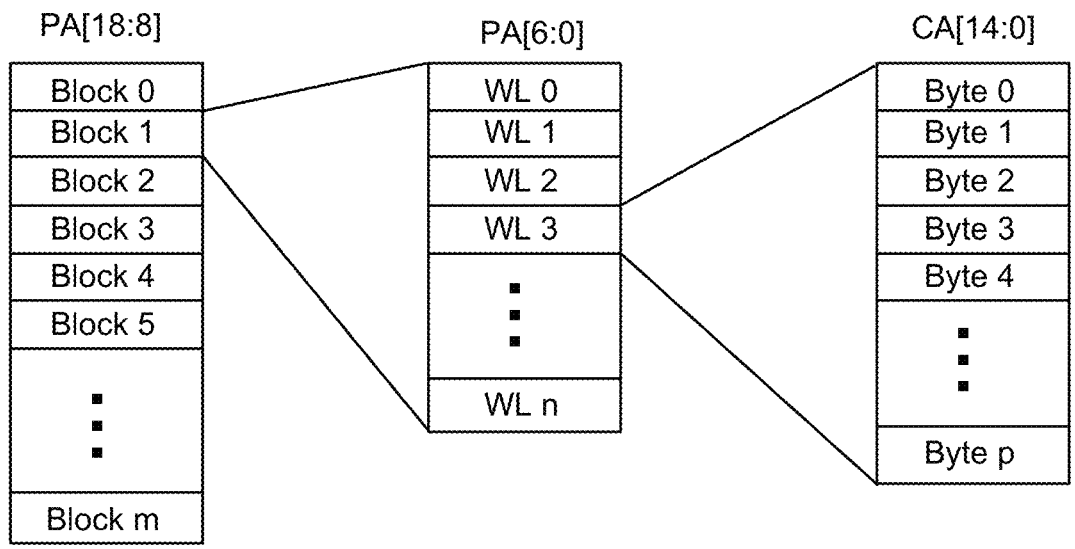
FIG. 11A describes SLC addressing.
FIG. 11B is a table showing how an address is transferred over multiple cycles.

FIGS. 11A and 11B describe the addressing for SLC. In one embodiment, SLC addresses include 37 bits designated as PA[21:0] and CA[14:0]. PA[21:19] is the memory die address. If multiple memory die are connected to the same CEn signal, then PA[21:19] can be used to distinguish between those memory die. Thus, in this embodiment, up to eight memory die can be connected to the same CE signal. FIG. 11A shows that PA[18:8] is the block address for identifying any of Block 0, Block 1, Block 2, . . . Block m. PA[7] is the plane address. Some memory arrays are broken into two planes. PA[6:0] is the word line address for identifying any of WL0, WL1, WL2, . . . WLn. Each block has its own set of word lines. CA[14:0] is the column address or byte address, indicating the byte position. The column address can be used to identify any of Byte 0, Byte 1, Byte 2, . . . Byte p. Each word line has its own set of column addresses. Because the address is 37 bits and the signal Bus[7:0] is eight bits wide, transmission of the address is broken into five cycles, as depicted in FIG. 11B (which depicts which address bits are transmitted on which signal bus lines during which cycle).

Figure 12:
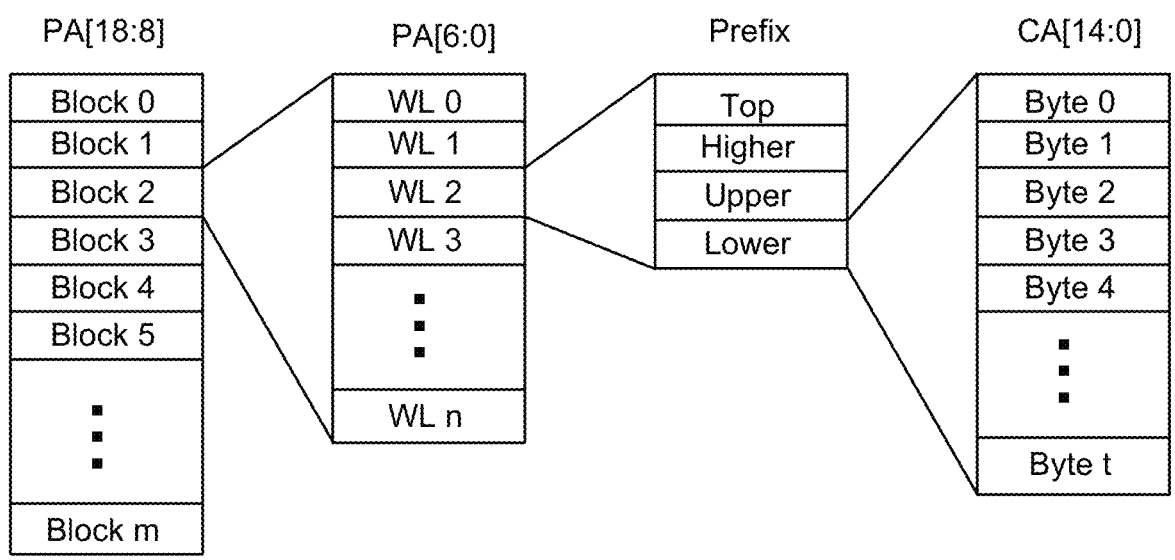
FIG. 12 describes MLC addressing.

FIG. 12 graphically describes the addressing for one example of MLC that uses four bits per memory cell. In one embodiment, MLC addresses include 37 bits designated as PA[21:0] and CA[14:0], the same as SLC. In addition, in one embodiment, the four bits of data in each memory cell are stored in different pages. A Prefix to the program and read commands is used to indicate which page (e.g., Lower Page, Upper Page, Higher Page, Top Page) is the focus of the command. Each page includes its own set of bytes (Bytes 0, Byte 1, . . . Byte t) that are addressed by the column address CA[14:0]. The table of FIG. 11B applies to the MLC addressing of FIG. 12.

Figure 13:
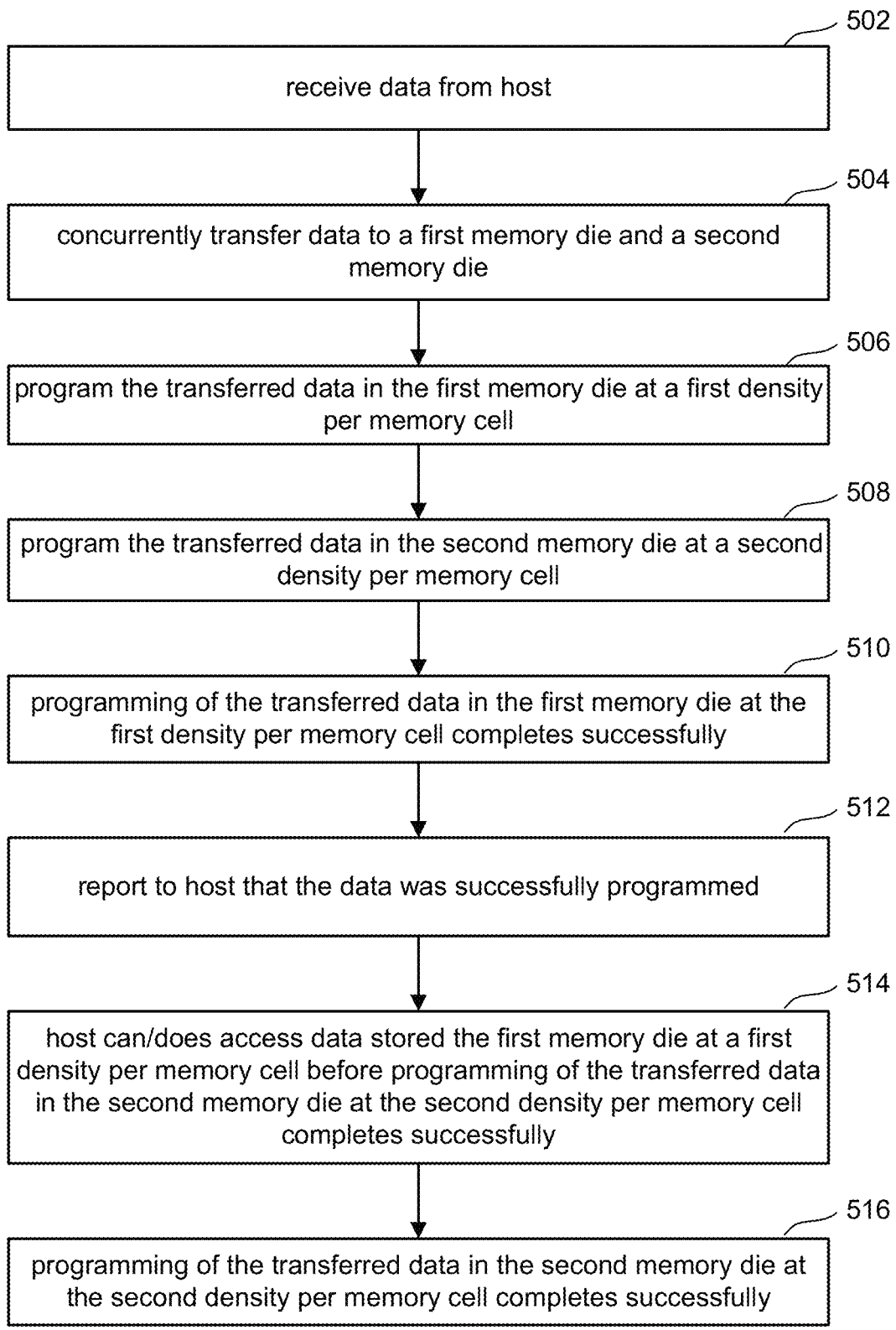
FIG. 13 is a flow chart describing one embodiment of a process for programming.

FIG. 13 is a flow chart describing one embodiment of a method for concurrently performing single bit per memory cell programming of first data to one or more memory die and multiple bit per memory cell programming of the first data to the one or more memory die using a common data transfer. In one example implementation, the process of FIG. 13 includes performing programming of a first copy of the data to a first memory die and programming of a second copy of the data to a second memory die, using a common data transfer to the first memory die and the second memory die. In one embodiment, the process of FIG. 13 is performed by controller 102. For example, a memory system may comprise a plurality of memory dies each having non-volatile memory cells and a control circuit (e.g., controller 102) connected to the memory dies, where the control circuit (e.g., controller 102) is configured to perform the process of FIG. 13. In other embodiments, all or a portion of the process of FIG. 13 is performed on memory die 300; for example, by a state machine, microcontroller, or other electrical circuits. In one embodiment, the steps of FIG. 13 are performed in an order different than as depicted in FIG. 13.

In step 502 of FIG. 13, controller 102 receives data from host 120. In some embodiments, controller 102 performs an ECC process to add error correction codes/information to the data, resulting in a set of code words to be stored in the memory. In step 504, controller 102 concurrently transfers the data received from the host to a first memory die and a second memory die. In one example, the first memory die and the second memory die are two memory die 300 on a common package that have different chip enable signals or the same chip enable signal. In other embodiments, the two memory die can be on different packages. In step 506, controller 102 programs the transferred data into the first memory die at a first density per memory cell. In one embodiment, one example of a first density is one bit per memory cell (e.g., SLC data). In step 508, controller 102 programs the transferred data into the second memory die at a second density per memory cell. For example, the second density per memory cell could be multiple bits per memory cell (e.g., MLC data). In one embodiment, the programming of the same transferred data into the first memory die and into the second memory die is performed concurrently.

For purposes of this document, the term concurrently means that the two processes overlap in time. They may start and stop at different times but there is one point in time when both processes are active.

In step 510, the programming of the transferred data into the first memory die at the first density per memory cell completes successfully. In one example, it is assumed that the programming of the data into the first memory die at the first density per memory cell completes before the programming of the same data into the second memory die at the second density per memory cell completes. Therefore, when step 510 is performed, meaning that programming to the first memory die has completed successfully, programming to the second memory die is still being performed. In step 512, controller 102 reports to host 120 that the data (sent from the host to the controller in step 502) has been successfully programmed. That is, the controller is configured to report successful programming of the data to the host subsequent to the completion of programming of the transferred data in the first memory die at the first density per memory cell and prior to the completion of programming of the transferred data in the second memory die at the second density per memory cell.

In step 514, the host (or other user) can (or does) access the data that was programmed. In one embodiment, the host does not know that the data was programmed to two memory dies at different densities. The host only knows that the host sent data to be programmed and that data was programmed successfully. Therefore, the host can now read back the data. That read operation will be performed from the first memory die at the first density per memory cell. Step 514 is performed before the programming of the transferred data in the second memory die at the second density per memory cell has completed successfully. Therefore, while the data will be stored long-term as MLC data, in step 514 the host can access the data as SLC data before the MLC data has completed programming. Thus, the programming process appears to be performed faster, at least from the point of view of the host.

In step 516, programming of the transferred data into the second memory die at the second density per memory cell completes successfully. Optionally, once the programming to the second memory die has completed successfully, the copy of the data in the first memory die can be discarded, erased, or overwritten, etc. After step 516 is performed, the data is now stored persistently for long-term storage as MLC data in the second memory die. As discussed above, MLC data is more compact and efficiently stored than SLC data. Therefore, more data can be fit in the memory array as MLC data than can be fit in the memory array as SLC data. In the embodiment of FIG. 13, a controller sends one copy of the data over the signal bus BUS[7:0] to two memory die simultaneously. One memory die will program as SLC data and the other memory die will concurrently program as MLC data, both programming processes being performed in response to the same transfer of data on the same signal bus.

Figure 14:
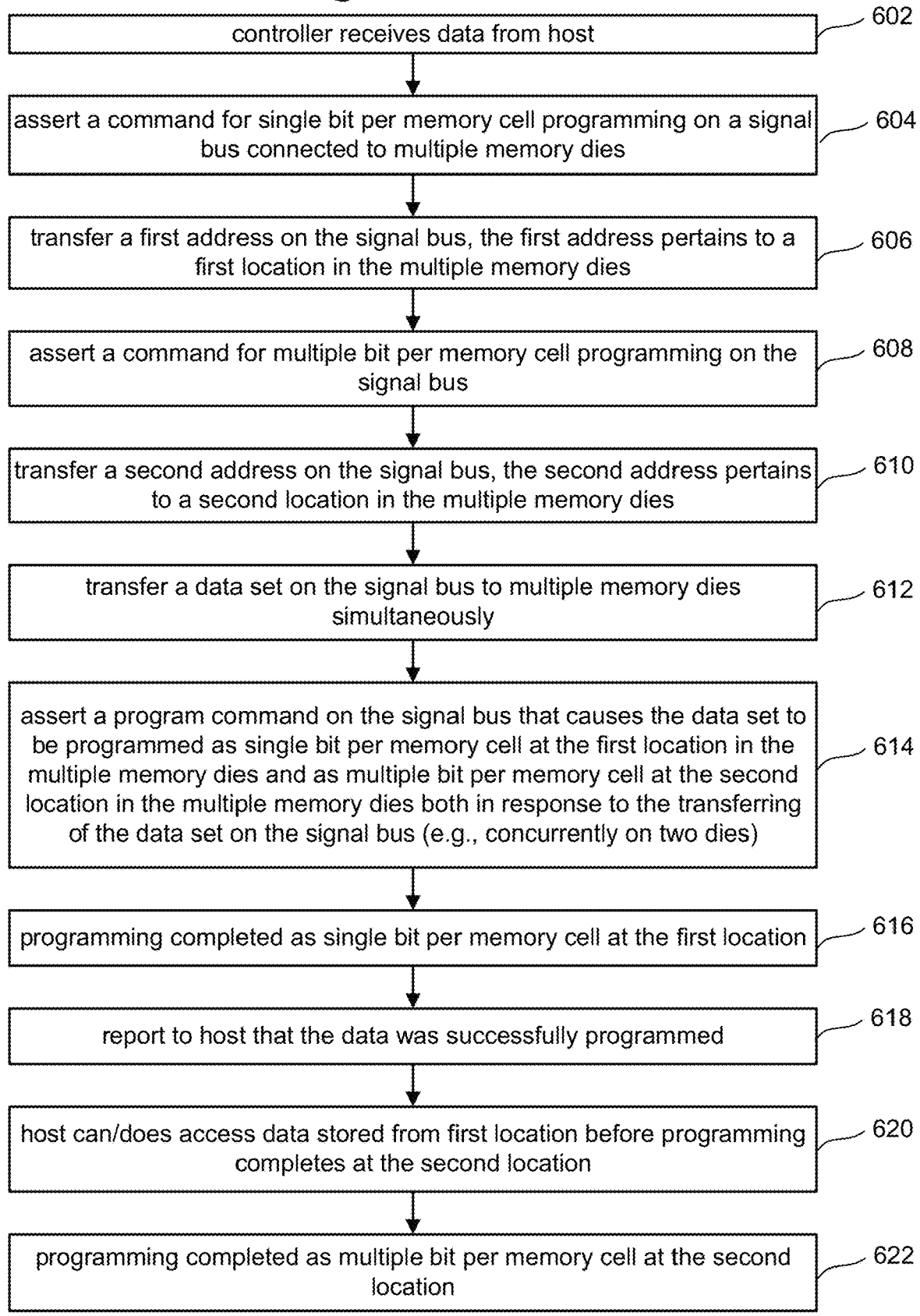
FIG. 14 is a flow chart describing one embodiment of a process for programming.

FIG. 14 is a flow chart describing another embodiment of a method for performing single bit per memory cell programming of first data to one or more memory die and multiple bit per memory cell programming of the first data to the one or more memory die using a common data transfer. In one embodiment, the process of FIG. 14 is performed by controller 102. For example, a memory system may comprise a plurality of memory dies each having non-volatile memory cells and a control circuit (e.g., controller 102) connected to the memory dies, where the control circuit (e.g., controller 102) is configured to perform the process of FIG. 14. In other embodiments, all or a portion of the process of FIG. 14 is performed on memory die 300; for example, by a state machine, microcontroller, or other electrical circuits. In one example, the process of FIG. 14 is one example implementation of the process of FIG. 13. In another implementation, the process of FIG. 14 is not performing the process of FIG. 13. In one embodiment, the steps of FIG. 14 are performed in an order different than as depicted in FIG. 14.

In step 602, controller 102 receives data from host 120. Step 602 is similar to step 502 of FIG. 13. In step 604, controller asserts a command for single bit per memory cell programming on the signal bus (e.g. BUS[7:0]) connected to the multiple memory dies and the controller. In step 606, controller 102 transfers a first address on the signal bus BUS[7:0] to the memory dies connected to the signal bus BUS[7:0]. The first address pertains to a first location in the multiple memory dies. The first address can be in the format discussed above with respect to FIGS. 11A, 11B and 12. The first location can be on a single memory die or spread across multiple memory die. In step 608, controller 102 asserts a command for multiple bit memory cell programming on the signal bus BUS[7:0]. In step 610, controller 102 transfers a second address on the signal bus BUS[7:0]. The second address pertains to a second location in the multiple memory die. That second location can be in one memory die or across multiple memory dies. The first location is different than the second location. Thus, the system is setting up for two programming processes. The first programming process at a first location as SLC data and a second programming process at a second location as MLC data.

In step 612, controller 102 transfers a data set on the signal bus BUS[7:0] to multiple memory dies simultaneously. Thus, the two programming processes discussed above will be programming the same data set transferred in one transfer. In step 614, controller 102 asserts a program command on the signal bus BUS[7:0] that caused the data set (transfer in step 612) to be programmed as SLC data at the first location and as MLC data at the second location, both programming processes being performed in response to the same transferring of the data set on the signal bus BUS[7:0]. In one example implementation, the two programming processes are performed concurrently. In response to the command from the controller on the signal bus BUS[7:0], the addressed memory dies (at least two memory dies) will program the data received in step 612 into the addressed locations in the memory dies. In step 616, the SLC programming process at the first location is completed. In step 618, controller 102 reports to host 120 that the data (received in step 602) was successfully programmed. The host is not aware that the data was programmed as two copies: SLC and MLC. Rather, in one embodiment, host 120 only knows that it requested data to be programmed and in step 618 the host was notified (prior to completion of programming as MLC data) that the data has been successfully programmed. Step 618 of FIG. 14 is similar to step 512 of FIG. 13. In step 620, the host can (and does) access the data stored in the first location before programming completes at the second location. Step 620 of FIG. 14 is analogous to step 514 of FIG. 13. In step 622, the programming of the MLC data at the second location completes. At this point, the system can (optionally) delete the copy of the data set as SLC data at the first location. Step 622 of FIG. 14 is analogous to step 516 of FIG. 13.

Figure 15:
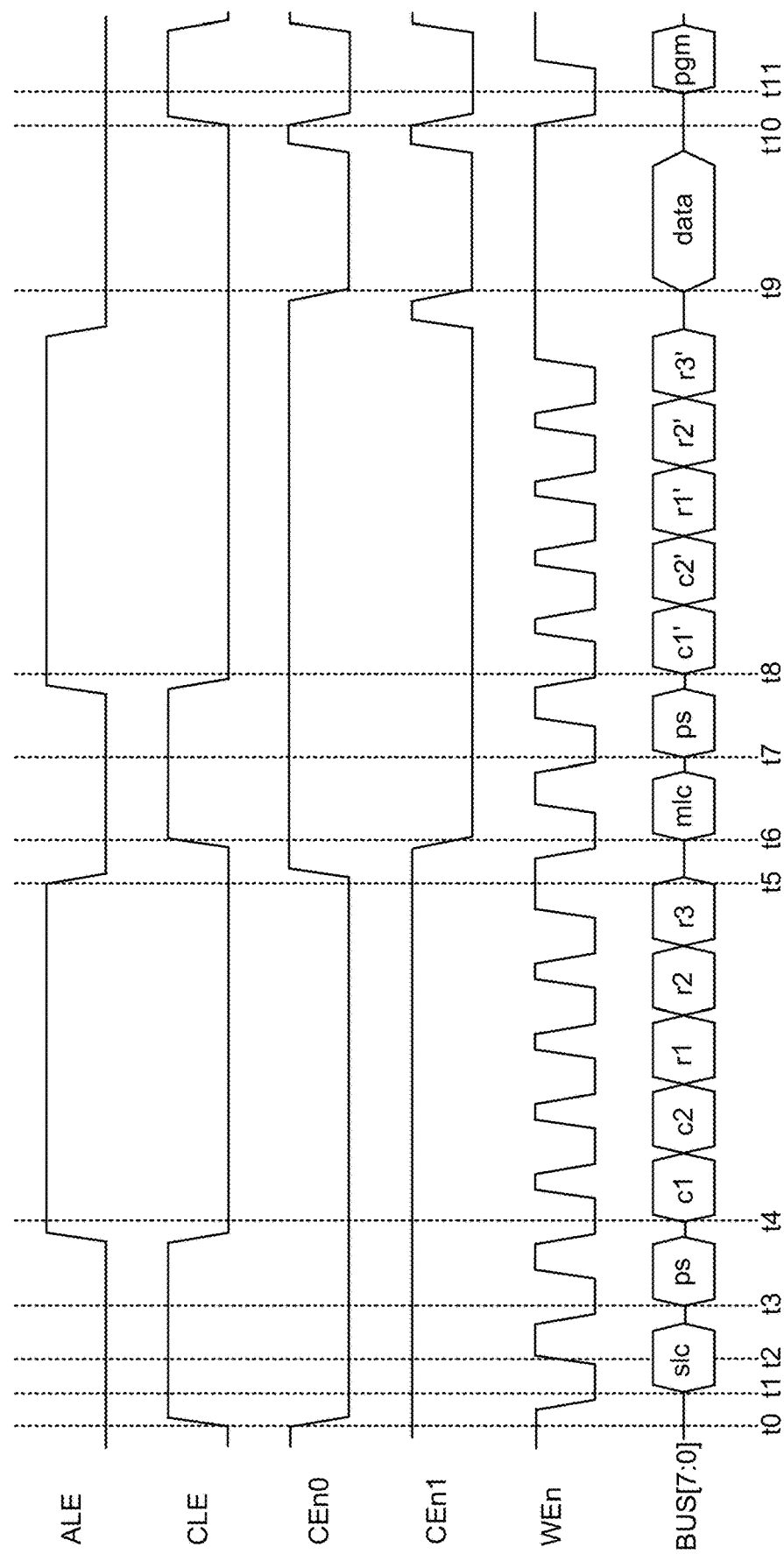
FIG. 15 is a signal timing diagram describing one embodiment of a process for programming.

FIG. 15 is a signal timing diagram that describes the behavior of various signals of the memory interface signals 294 between a controller (or other control circuit) and one or more memory die. More specifically, FIG. 15 depicts the behavior of the following signals: ALE, CLE, CEn0, CEn1, WEn, BUS[7:0] (See Table 1, above). Note that this embodiment includes at least two chip enable signals CEn: CEn0 and CEn1. Up to four memory die 300 are connected to CEn0. Up to four memory die 300 are connected to CEn1. In one embodiment, the same signal bus BUS[7:0] is connected to the controller and all of the memory die 300 that are connected to CEn0 and CEn1. The time period depicted in FIG. 15 corresponds to steps 504-508 of FIG. 13 and steps 604-614 of FIG. 14.

At time t0, ALE is low (e.g. 0 volts), CLE goes high (e.g., 2.5 volts, 3 volts, 5 volts or other value representing logic 1), CEn0 goes low, CEn1 is high, WEn will go low shortly thereafter, and BUS[7:0] is at a "don't care" state. At time t1, controller 102 asserts a command for single bit per memory cell programming on the signal bus BUS[7:0] ("slc"). This command is latched by the memory die on the rising edge of WEn at time t2. At time t3, controller 102 asserts a programming start command on the signal bus BUS[7:0] ("ps"). Together the "slc" command and "ps" command represent a command to the memory die that SLC programming should be performed, and represent on example implantation of step 604 of FIG. 14.

Starting at t4 and ending at t5 are five address cycles as per FIG. 11B. The first address cycle transfers address portion c1. The second address cycle transfers address portion c2. The third address cycle transfers address portion r1. The fourth address cycle transfers address portion r2. The fifth cycle transfers address portion r3. These five cycles correspond to the data as depicted in the table of FIG. 11B. Each of the address portions on each address cycle is latched by the receiving memory dies on the rising edge of WEn. During the five address cycles from time t4 to time t5, ALE is high and CLE is low so that the addresses are properly latched. Also during the five address cycles from time t4 to time t5, CEn0 is low; therefore, the address cycles between times t4 and t5 pertain to an address for a memory die that is connected to CEn0. The five address cycles between times t4 and t5 correspond to step 606 of FIG. 14.

Between time t5 and time t6, ALE is brought low, CLE is raised high, CEn0 is raised high and CEn1 is brought low. When CEn0 is raised at t5, then the memory die connected to CEn0 will no longer be selected. When CEn1 is lowered at t6, a memory die connected to CEn1 will be selected for the next operation. At time t6, controller 102 sends a command for MLC programming ("mlc"). At time t7, controller 102 issues a program start command "ps" on the signal bus BUS[7:0]. The two commands mlc and ps between times t6 and t8 correspond to step 608 of FIG. 14. By time t8, ALE is raised high and CLE is lowered so that addresses will be latched.

Between times t8 and t9 are five address cycles for transmitting the five portions of the addresses labeled as c1', c2', r1 r2' and r3'. The five address cycles between t8 and t9 represent step 610 of FIG. 14. Between times t8 and t9, CEn1 is lowered so that the addresses will be latched by a memory die connected to CEn1.

At time t9, data is transferred on the signal bus BUS[7:0]. This transfer of data between t9 and t10 corresponds to step 504 of FIG. 13 and step 612 of FIG. 14. The size of the data transfer is not drawn to scale in FIG. 15, as the data can be ten bytes or another quantity of data. At time t9, CEn0 and CEn1 are both low so that both memory dies (i.e. the first memory die that latched the first address at t4-t5 and the second memory die that latched the second address at t8-t9) are selected for receiving the data transferred between t9 and t10.

At time t11, controller 102 asserts a program command on the signal bus BUS[7:0] that causes the data set to be programmed at a single bit per memory cell on one memory die and multiple bit per memory cell on the second memory die. At time t11, the chip enable signal CEn0 and chip enable signal CEn1 are both lowered so that both memory die that have received addresses are selected for the program command. If there are multiple memory die connected to each of the CEn0 and CEn1, then the address (e.g. PA [21:19]) is used to select a memory die for programming. So, in one example embodiment, one memory die at a time receives an address in the first set of five address cycles (t4-t5), another memory die receives the address in the second set of five address cycles (t8-t9), and both memory die will program the same data concurrently in response to the command transferred at time t11. This program command sent on the signal bus BUS[7:0] at time t11 corresponds to step 614 of FIG. 14 and steps 506 and 508 of FIG. 13.

The embodiment of FIG. 15 corresponds to a structure where a first chip enable signal is connected to the first memory die and the control circuit; a second chip enable signal is connected to the second memory die and the control circuit; the control circuit is configured to concurrently transfer the data to the first memory die and the second memory die while asserting the first chip enable signal and the second chip enable signal; the control circuit is configured to send a first address to the first memory die and the second memory die while asserting the first chip enable signal and not asserting the second chip enable signal, the first address pertains to a first location in the first memory die for programming the data; and the control circuit is configured to send a second address to the first memory die and the second memory die while asserting the second chip enable signal and not asserting the first chip enable signal, the second address pertains to a second location in the second memory die for programming the data.

Figure 16:
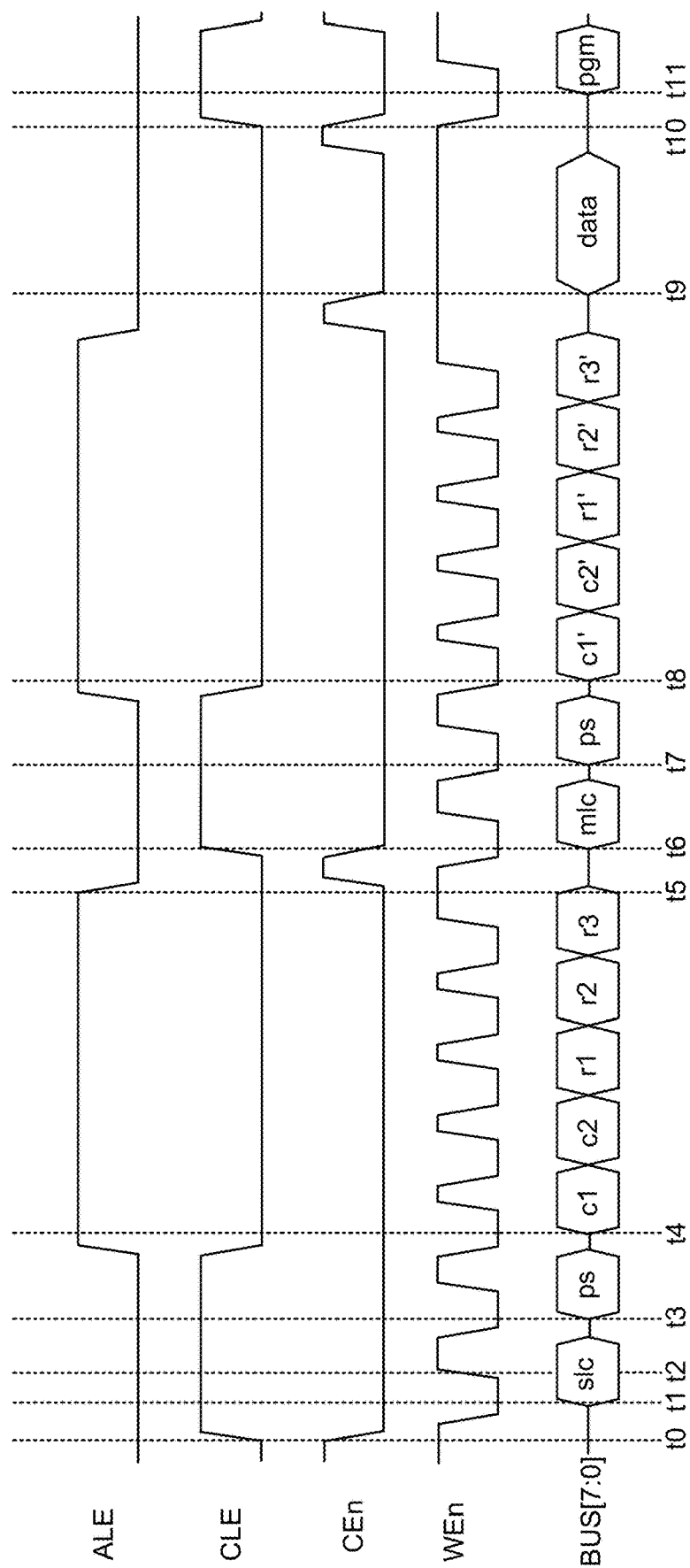
FIG. 16 is a signal timing diagram describing one embodiment of a process for programming.

FIG. 16 is a signal timing diagram that describes the behavior of various signals of the memory interface signals 294 between a controller (or other control circuit) and one or more memory die. More specifically, FIG. 16 depicts the behavior of the following signals: ALE, CLE, CEn0, WEn, BUS[7:0]. Note that this embodiment includes one chip enable signal CEn. Up to four memory die 300 are connected to CEn. In FIG. 16, CEn goes low at t0, high at t5, low at t6, high and low before t9, and high and low by t10. In one embodiment, the same signal bus BUS[7:0] is connected to the controller and all of the memory die 300 that are connected to CEn. The time period depicted in FIG. 16 corresponds to steps 504-508 of FIG. 13 and steps 604-614 of FIG. 14.

A difference between the embodiment of FIG. 15 and the embodiment of FIG. 16 is that in FIG. 15 the chip enable signal CEn can be used to select a memory die for programming while in FIG. 16 the memory dies receive the same chip enable so that the addressing (e.g., PA[21:19]) is used to select the memory die for programming. The signals ALE, CLE, WEn and BUS[7:0] operate the same in FIG. 16 as they do in FIG. 15, with PA[21:19] of r3 and r3' being different.

The embodiment of FIG. 16 corresponds to a structure where a single chip enable signal is connected to the first memory die, the second memory die and the control circuit; the control circuit is configured to concurrently transfer the data to the first memory die and the second memory die while asserting the chip enable signal; the control circuit is configured to send a first address to the first memory die and the second memory die while asserting the chip enable signal, the first address pertains to a first location in the first memory die for programming the data; and the control circuit is configured to send a second address to the first memory die and the second memory die while asserting the chip enable signal, the second address pertains to a second location in the second memory die for programming the data.

In one embodiment, the data can be programmed into the memory cells in two stages. During the first stage, the memory cells are programmed to wider overlapping threshold voltage distributions. During the second stage, the memory cells are programmed from the wider overlapping threshold voltage distributions to narrower non-overlapping threshold voltage distributions. Some systems require that the data be re-transferred over BUS[7:0] for the second stage. In such a system, the first transfer of the data over BUS[7:0] will be for the SLC programming and the first stage of the MLC programming (e.g., the start of the MLC programming).

In some embodiments, the SLC programming is performed concurrently with the MLC programming. In other embodiments, the programming is not performed concurrently. For instance, the MLC data may be stored in a buffer, combined with other MLC data subsequent to the programming of the SLC data and then subsequently stored as MLC data as combined.

Figure 17:
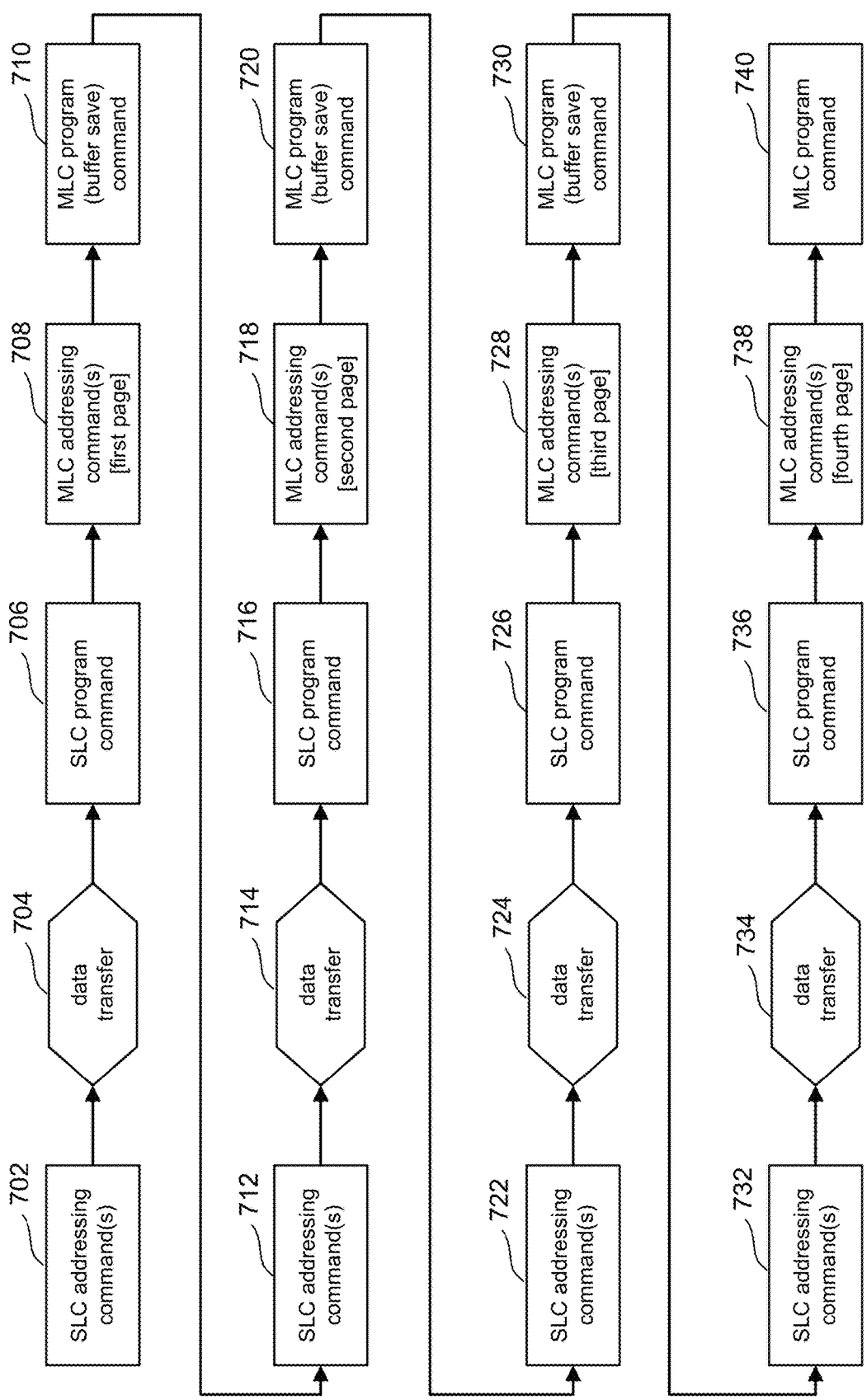
FIG. 17 is a flow chart describing one embodiment of a process for programming.

FIG. 17 is a flow chart describing another embodiment of a method for performing single bit per memory cell programming of first data to one or more memory die and multiple bit per memory cell programming of the first data to the one or more memory die using a common data transfer. In one embodiment, the process of FIG. 17 is performed by controller 102. For example, a memory system may comprise a plurality of memory dies each having non-volatile memory cells and a control circuit (e.g., controller 102) connected to the memory dies, where the control circuit (e.g., controller 102) is configured to perform the process of FIG. 17. In other embodiments, all or a portion of the process of FIG. 17 is performed on memory die 300; for example, by a state machine, microcontroller, or other electrical circuits. In one embodiment, the steps of FIG. 17 are performed in an order different than as depicted in FIG. 17.

In one embodiment of the process of FIG. 17, the data is programmed to two different blocks in the same memory die. In some implementations, the memory die includes a series of latches (e.g., part of the sense blocks 350) for storing data to be programmed. Some example implementations will include four latches per sense amplifier or per bit line. First, data will be stored in the latches and programmed as SLC. Subsequently, taking advantage of the data being in the latches, the same data (from the same transfer) is then programmed again as MLC data.

In step 702 of FIG. 17, controller 102 sends the appropriate addressing commands to the target memory die (or multiple memory die that share the same signals) for SLC programming. Step 702 can include sending a command and an address. For example, step 702 can correspond to the commands and address asserted on BUS[7:0] of FIG. 15 between t1 and t5. In step 704, data for one page is transferred to the target memory die. In response to step 704, the target memory die stores the transferred data in the set of latches discussed above. In step 706, controller 102 sends a command to the target memory die to program the data transferred in step 704 to the addressed block of memory as SLC data. In response to the command of step 706, the data is programmed into the addressed block of memory from the latches discussed above as SLC data. In step 708, controller 102 sends the appropriate addressing commands to the target memory die (or multiple memory die that share the same signals) for MLC programming. Step 708 can include sending a command and an address. For example, step 708 can correspond to the commands and address asserted on BUS [7:0] of FIG. 15 between t6 and t9. The command and address sent in step 708 corresponds to the first page of multiple pages of data. This example assumes four bits per memory cell; however, more or less than four bits per memory cell can be implemented. The data is stored as four pages of data, as described above. Step 702-710 pertain to the first of four pages of data. In step 710, controller 102 sends a buffer save command to the target memory die to save the data in the latches so it can be programmed later.

In step 712 of FIG. 17, controller 102 sends the appropriate addressing commands to the target memory die (or multiple memory die that share the same signals) for SLC programming. Step 712 can include sending a command and an address. For example, step 712 can correspond to the commands and address asserted on BUS[7:0] of FIG. 15 between t1 and t5. In step 714, data for one page (the second page) is transferred to the target memory die. In response to step 714, the target memory die stores the transferred data in the set of latches discussed above. In step 716, controller 102 sends a command to the target memory die to program the data transferred in step 714 to the addressed block of memory as SLC data. In response to the command of step 716, the data is programmed into the addressed block of memory from the latches discussed above as SLC data. In step 718, controller 102 sends the appropriate addressing commands to the target memory die (or multiple memory die that share the same signals) for MLC programming. Step 718 can include sending a command and an address. For example, step 718 can correspond to the commands and address asserted on BUS[7:0] of FIG. 15 between t6 and t9. The command and address sent in step 718 correspond to the second page of multiple pages of data. In step 720, controller 102 sends a buffer save command to the target memory die to save the data for the second page in the latches so it can be programmed later. Step 712-720 pertain to the second of four pages of data.

In step 722 of FIG. 17, controller 102 sends the appropriate addressing commands to the target memory die (or multiple memory die that share the same signals) for SLC programming. Step 722 can include sending a command and an address. For example, step 722 can correspond to the commands and address asserted on BUS[7:0] of FIG. 15 between t1 and t5. In step 724, data for one page (the third page) is transferred to the target memory die. In response to step 724, the target memory die stores the transferred data in the set of latches discussed above. In step 726, controller 102 sends a command to the target memory die to program the data transferred in step 724 to the addressed block of memory as SLC data. In response to step 726, the data is programmed into the addressed block of memory from the latches discussed above as SLC data. In step 728, controller 102 sends the appropriate addressing commands to the target memory die (or multiple memory die that share the same signals) for MLC programming. Step 728 can include sending a command and an address. For example, step 728 can correspond to the commands and address asserted on BUS [7:0] of FIG. 15 between t6 and t9. The command and address sent in step 728 correspond to the third page of the multiple pages of data. In step 730, controller 102 sends a buffer save command to the target memory die to save the data for the third page in the latches so it can be programmed later. Step 722-730 pertain to the third of four pages of data.

In step 732 of FIG. 17, controller 102 sends the appropriate addressing commands to the target memory die (or multiple memory die that share the same signals) for SLC programming. Step 732 can include sending a command and an address. For example, step 732 can correspond to the commands and address asserted on BUS[7:0] of FIG. 15 between t1 and t5. In step 734, data for one page (the fourth page) is transferred to the target memory die. In response to step 734, the target memory die stores the transferred data in the set of latches discussed above. In step 736, controller 102 sends a command to the target memory die to program the data transferred in step 734 to the addressed block of memory as SLC data. In response to step 736, the data is programmed into the addressed block of memory from the latches discussed above as SLC data. In step 738, controller 102 sends the appropriate addressing commands to the target memory die (or multiple memory die that share the same signals) for MLC programming. Step 738 can include sending a command and an address. For example, step 738 can correspond to the commands and address asserted on BUS [7:0] of FIG. 15 between t6 and t9. The command and address sent in step 738 correspond to the fourth page of the multiple pages. In step 740, controller 102 sends a program command to the target memory die to program the data for the four pages of data currently stored in the latches. In response to the command in step 740, the target memory die programs the four pages of data as MLC data.

The above technology allows for data to be stored quickly (from the point of view of the user/host) as SLC and compactly in the long term as MLC, without tying up the memory system's data bus and while allowing flexibility with addressing (e.g., different memory dies can be used).

One embodiment includes an apparatus comprising a plurality of memory dies each having non-volatile memory cells and a control circuit connected to the memory dies. The control circuit is configured to concurrently transfer data to a first memory die and a second memory die of the plurality of memory dies. The control circuit is further configured to program the transferred data in the first memory die at a first density per memory cell and program the transferred data in the second memory die at a second density per memory cell.

In one example implementation, the control circuit is configured to program the transferred data in the first memory die at the first density per memory cell in response to a first transfer of the data to the first memory dies, the control circuit is configured to start programming of the transferred data in the second die at the second density per memory cell in response to the first transfer of the data and complete programming of the transferred data in the second die at the second density per memory cell in response to a second transfer of the data.

In one example implementation, the control circuit is configured to program the transferred data in the first memory die at the first density per memory cell concurrently with the programming of the transferred data in the second die at the second density per memory cell.

In one example implementation, the control circuit is configured to combine the transferred data with other data and program the transferred data combined with other data in the second memory die at the second density per memory cell subsequent to the programming of the transferred data in the first die at the first density per memory cell.

One example implementation further comprises a first chip enable signal connected to the first memory die and the control circuit; a second chip enable signal connected to the second memory die and the control circuit; the control circuit is configured to concurrently transfer the data to the first memory die and the second memory die while asserting the first chip enable signal and the second chip enable signal; the control circuit is configured to send a first address to the first memory die and the second memory die while asserting the first chip enable signal and not asserting the second chip enable signal, the first address pertains to a first location in the first memory die for programming the data; and the control circuit is configured to send a second address to the first memory die and the second memory die while asserting the second chip enable signal and not asserting the first chip enable signal, the second address pertains to a second location in the second memory die for programming the data.

One example implementation further comprises a chip enable signal connected to the first memory die, the second memory die and the control circuit; the control circuit is configured to concurrently transfer the data to the first memory die and the second memory die while asserting the chip enable signal; the control circuit is configured to send a first address to the first memory die and the second memory die while asserting the chip enable signal, the first address pertains to a first location in the first memory die for programming the data; and the control circuit is configured to send a second address to the first memory die and the second memory die while asserting the chip enable signal, the second address pertains to a second location in the second memory die for programming the data.

One embodiment includes a method comprising asserting a command for single bit per memory cell programming on a signal bus connected to multiple memory dies; transferring a first address on the signal bus, the first address pertains to a first location in the multiple memory dies; asserting a command for multiple bit per memory cell programming on the signal bus; transferring a second address on the signal bus, the second address pertains to a second location in the multiple memory dies; transferring a data set on the signal bus; and asserting a program command on the signal bus that causes the data set to be programmed as single bit per memory cell at the first location in the multiple memory dies and as multiple bit per memory cell at the second location in the multiple memory dies both in response to the transferring of the data set on the signal bus.

One embodiment includes a memory interface configured to communicate with one or more memory die that each have non-volatile memory cells and means for concurrently performing single bit per memory cell programming of first data to the one or more memory die and multiple bit per memory cell programming of the first data to the one or more memory die using a common data transfer. The means for concurrently performing single bit per memory cell programming of first data to the one or more memory die and multiple bit per memory cell programming of the first data to the one or more memory die using a common data transfer can be a microprocessor, microcontroller, other type of processor, FPGA, state machine, etc. performing any of the processes of FIGS. 13, 14, 15, 16 and/or 17. One example includes controller 102 performing any of the processes of FIGS. 13, 14, 15, 16 and/or 17. Other controller architectures can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of memory dies each having non-volatile memory cells; and
a control circuit connected to the memory dies, the control circuit is configured to concurrently transfer first data to a first temporary location on a first memory die of the plurality of memory dies and to a second temporary location on a second memory die of the plurality of memory dies as a common data transfer of the first data, the control circuit is further configured to program the transferred first data of the common data transfer from the first temporary location to non-volatile memory cells on the first memory die at a first density per memory cell and program the transferred first data of the common data transfer from the second temporary location to non-volatile memory cells on the second memory die at a second density per memory cell.

2. The apparatus of claim 1, wherein:
the first density per memory cell is one bit per memory cell; and
the second density per memory cell is multiple bit per memory cell.

3. The apparatus of claim 1, wherein:
the control circuit is configured to send a first address to the plurality of memory dies, the first address pertains to a first location in the first memory die;
the control circuit is configured to send a second address to the plurality of memory dies, the second address pertains to a second location in the second memory die; and
the control circuit is configured to program the transferred first data of the common data transfer to the first location in the first memory die at the first density per memory cell and program the transferred first data of the common data transfer to the second location in the second memory die at the second density per memory cell.

4. The apparatus of claim 1, wherein:
the control circuit asserts a single programming command to the plurality of memory dies that causes the first memory die to program the transferred first data in the first memory die at the first density per memory cell and the second memory die to program the transferred first data in the second die at the second density per memory cell.

5. The apparatus of claim 1, further comprising:
a signal bus connected to the control circuit and the memory dies, the control circuit is configured to concurrently transfer the first data to the first memory die and the second memory die over the signal bus during the common data transfer.

6. The apparatus of claim 5, wherein:
the control circuit is configured to program the transferred first data to non-volatile memory cells on the first memory die at the first density per memory cell and start programming the transferred first data to non-volatile memory cells on the second memory die at the second density per memory cell in response to one transferring of the first data over the signal bus by asserting one or more programming commands on the signal bus.

7. The apparatus of claim 5, wherein:
the control circuit is configured to send a first address on the signal bus, the first address pertains to a first location in the first memory die; and
the control circuit is configured to send a second address on the signal bus, the second address pertains to a second location in the second memory die.

8. The apparatus of claim 7, wherein:
the control circuit is configured to send a command for first density per memory cell programming on the signal bus for the first address;
the control circuit is configured to send a command for second density per memory cell programming on the signal bus for the second address; and
the control circuit asserts a programming command on the signal bus that causes the first memory die to program the transferred first data to non-volatile memory cells on the first memory die at the first density per memory cell and the second memory die to program the transferred first data to non-volatile memory cells on the second die at the second density per memory cell.

9. The apparatus of claim 1, wherein:
the control circuit is configured to receive the first data from a host; and
the control circuit is configured to report successful programming of the first data to the host subsequent to completion of programming of the transferred first data to non-volatile memory cells on the first memory die at the first density per memory cell and prior to completion of programming the transferred first data to non-volatile memory cells on the second die at the second density per memory cell.

10. The apparatus of claim 1, wherein:
the non-volatile storage apparatus is a solid state drive; and
the control circuit is a controller in the solid state drive.

11. The apparatus of claim 1, wherein:
the control circuit is configured to program the transferred first data to non-volatile memory cells on the first memory die at the first density per memory cell concurrently with the programming of the transferred first data to non-volatile memory cells on the second die at the second density per memory cell.

12. The apparatus of claim 1, wherein:
the control circuit is configured to combine the transferred first data with other data and program the transferred first data combined with other data to non-volatile memory cells on the second memory die at the second density per memory cell subsequent to the programming of the transferred first data to non-volatile memory cells on the first die at the first density per memory cell.

13. The apparatus of claim 1, further comprising:
a first chip enable signal connected to the first memory die and the control circuit;
a second chip enable signal connected to the second memory die and the control circuit;
the control circuit is configured to concurrently transfer the first data to the first memory die and the second memory die while asserting the first chip enable signal and the second chip enable signal;
the control circuit is configured to send a first address to the first memory die and the second memory die while asserting the first chip enable signal and not asserting the second chip enable signal, the first address pertains to a first location in the first memory die for programming the first data; and
the control circuit is configured to send a second address to the first memory die and the second memory die while asserting the second chip enable signal and not asserting the first chip enable signal, the second address pertains to a second location in the second memory die for programming the first data.

14. The apparatus of claim 1, further comprising:
a chip enable signal connected to the first memory die, the second memory die and the control circuit;
the control circuit is configured to concurrently transfer the first data to the first memory die and the second memory die while asserting the chip enable signal;
the control circuit is configured to send a first address to the first memory die and the second memory die while asserting the chip enable signal, the first address pertains to a first location in the first memory die for programming the first data; and
the control circuit is configured to send a second address to the first memory die and the second memory die while asserting the chip enable signal, the second address pertains to a second location in the second memory die for programming the first data.

15. A method, comprising:
asserting a command for single bit per memory cell programming on a signal bus connected to multiple memory dies;
transferring a first address on the signal bus, the first address pertains to a first location in the multiple memory dies;
asserting a command for multiple bit per memory cell programming on the signal bus;
transferring a second address on the signal bus, the second address pertains to a second location in the multiple memory dies;
transferring a data set on the signal bus to one or more temporary locations in the multiple memory dies; and
asserting a program command on the signal bus that causes the data set to be programmed from the one or more temporary locations as both single bit per memory cell at the first location in the multiple memory dies and as multiple bit per memory cell at the second location in the multiple memory dies both in response to one transferring of the data set on the signal bus.

16. The method of claim 15, wherein:
the first location in the multiple memory dies includes memory cells in a first memory die of the multiple memory dies; and the second location in the multiple memory dies includes memory cells in a second memory die of the multiple memory dies.

17. The method of claim 16, wherein:
the asserting the program command comprises asserting the program command to the first memory die and to the second memory die that causes the data set to be concurrently programmed as single bit per memory cell at the first location on the first memory die and as multiple bit per memory cell at the second location on the second memory die.

18. The method of claim 15, wherein:
asserting the first address on the signal bus comprises asserting different portions of the first address during different address cycles on the signal bus of a first set of address cycles subsequent to the command for single bit per memory cell programming and prior to the program command; and
asserting the second address on the signal bus comprises asserting different portions of the second address during different address cycles on the signal bus of a second set of address cycles subsequent to the command for multiple bit per memory cell programming and prior to the program command.

19. An apparatus, comprising:
a memory interface configured to communicate with one or more memory die that each have non-volatile memory cells; and
means for transferring first data to one or more temporary locations in the one or more memory die over a single signal bus via the memory interface as part of a common data transfer of the first data to the one or more memory die and causing concurrent performing of single bit per memory cell programming of the first data transferred in the common data transfer to a first location in the one or more memory die and multiple bit per memory cell programming of the same first data transferred in the common data transfer to a second location in the one or more memory die.

* * * * *